United States Patent [19]

Lee

[11] 4,057,766

[45] Nov. 8, 1977

[54] ACTIVE NETWORKS HAVING BIQUADRATIC TRANSFER FUNCTIONS

[75] Inventor: Man Shek Lee, Belmont, Calif.

[73] Assignee: GTE Automatic Electric Laboratories Incorporated, Northlake, Ill.

[21] Appl. No.: 718,730

[22] Filed: Aug. 30, 1976

[51] Int. Cl.² ............................................. H03F 1/36
[52] U.S. Cl. ...................................... 330/107; 330/85
[58] Field of Search ..................... 330/107, 109, 85; 328/167

[56] References Cited

U.S. PATENT DOCUMENTS

| 3,501,716 | 3/1970 | Ferch et al. ............................. 333/80 |
| 3,715,679 | 2/1973 | Fleischer ............................. 330/107 |

OTHER PUBLICATIONS

Tow, "Active RC Filters-A State-Space Realization," *Proceedings Letters, Proceedings of the IEEE*, June 1968, pp. 1137-1139.
Tow, "A Step-by-Step Active-Filter Design," *IEEE Spectrum*, Dec. 1969, pp. 64-68.
Thomas, "The Biquad; Part I-Some Practical Design Considerations," *IEEE Transactions on Circuit Theory*, vol. CT-18, No. 3, May 1971, pp. 350-357.
Thomas, "The Biquad: Part II—A Multipurpose Active Filtering System," *Ieee Transactions on Circuit Theory*, vol. CT-18, No. 3, May 1971, pp. 358-361.
Kerwin et al., "State-Variable Synthesis for Insensitive Integrated Circuit Transfer Functions," *IEEE Journal of Solid State Circuits*, vol. SC2, No. 3, Sept. 1967, pp. 87-92.

*Primary Examiner*—James B. Mullins
*Attorney, Agent, or Firm*—Russell A. Cannon; Leonard R. Cool

[57] ABSTRACT

First, second, and third single-input, single-output operational amplifiers having associated input resistors and feedback resistors are connected in series between input and output terminals. First and second capacitors are also connected across associated first and second amplifiers to provide a second-order network transfer function. A fourth feedback resistor is connected between the output terminal of the third amplifier and the amplifier side of the first input resistor. The amplifier input sides of the second and third input resistors are also connected through associated feed-forward resistors to the one side of the first input resistor that is spaced from the first amplifier. Appropriate selection of element values enables synthesis of circuits having prescribed biquadratic transfer functions.

10 Claims, 1 Drawing Figure

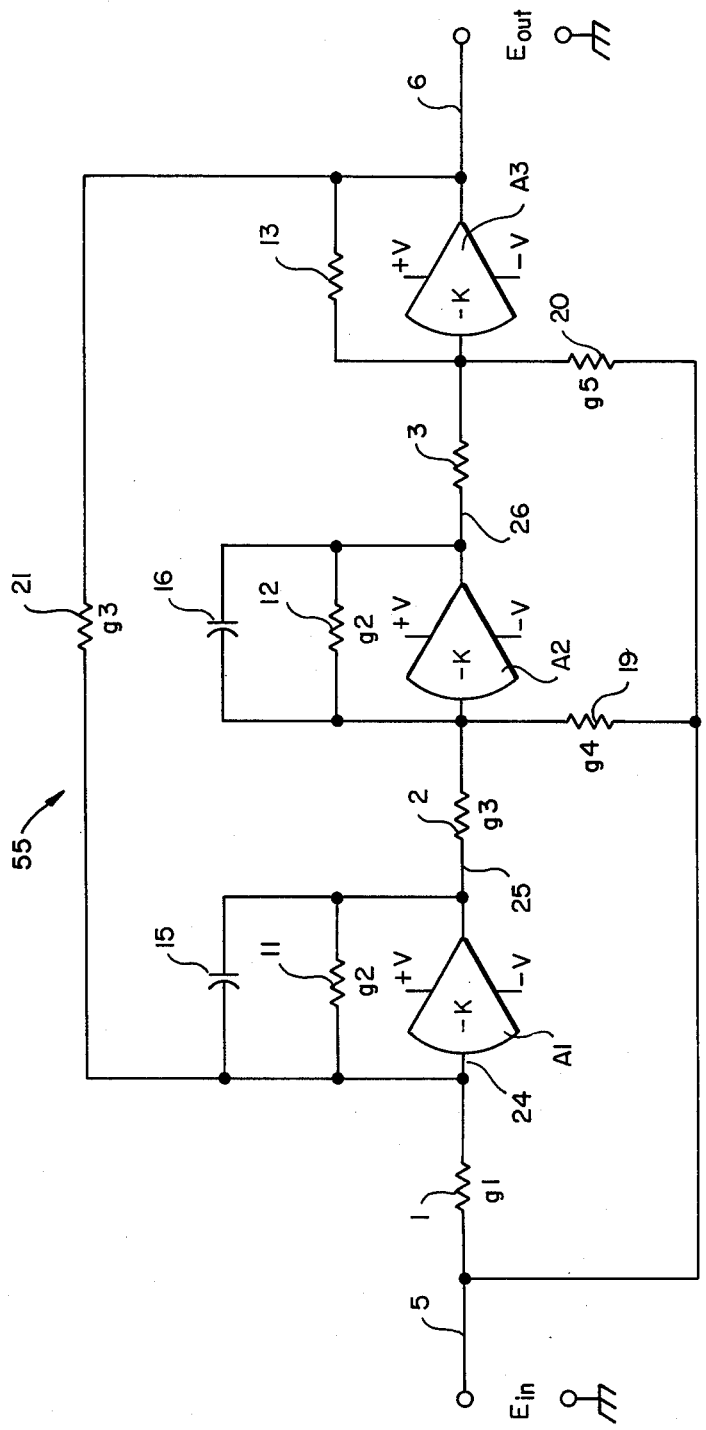

ACTIVE NETWORKS HAVING BIQUADRATIC TRANSFER FUNCTIONS

BACKGROUND OF INVENTION

This invention relates to active networks and more particularly to networks having biquadratic transfer functions.

A biquad circuit is considered to be one having a biquadratic transfer function which is generally defined as one where the denominator includes a second-order or $s^2$ term and the numerator is of degree two or less. Biquad circuits employing three and four operational amplifiers to simulate circuits having prescribed biquadratic transfer functions are described in prior-art literature such as "A Step-by-Step Active-Filter Design" by J. Tow, IEEE Spectrum, December 1969, pp. 64 - 68; and the Biquad — Parts I and II, by Lee C. Thomas, IEEE Transactions on Circuit Theory, volume Ct 18-3, May 1971, pp. 350-361.

An object of this invention is the provision of a versatile network having only three active elements and which can be adjusted to have prescribed second-order transfer functions.

DESCRIPTION OF PREFERRED EMBODIMENTS

This invention will now be described in relation to the single FIGURE of drawing, which is a schematic circuit diagram of a network 55 embodying this invention. The network 55 here comprises three amplifiers A1, A2, and A3 and associated input resistors 1, 2, and 3 which are connected in series between line 5 of an input port $E_{in}$ and line 6 of an output port $E_{out}$. The amplifiers are shown as having single-ended inputs and outputs. Alternatively, the amplifiers may have differential inputs and differential outputs, the other input lines being connected to ground and only one of the output lines being used. The actual polarity of the amplifier connections is selected to ensure that the network is DC stable. Terminals of the amplifiers are also connected to supply DC bias voltages in the conventional manner. The amplifiers A1 - A3 are preferably operational amplifiers. They are considered in the following discussion to be ideal amplifiers with zero output impedance, infinite input impedance, and infinite voltage gain. Although such an ideal operational amplifier does not exist in practice, this does not seriously affect the operation of the network 55. A non-ideal amplifier merely introduces extraneous terms in the transfer function for the network, which can easily be compensated for in a manner well known in the art, in order to produce a desired transfer function. In practice, the voltage gains K of the amplifiers are in the order of 100 or more. The values of the gains K of the amplifiers are positive so that the resultant term $-K$ is negative to provide inversion of the input signal and to ensure that the amplifiers are stable.

Feedback resistors 11, 12, and 13 are connected across associated amplifiers A1, A2, and A3. The resistances of feedback resistors 11 and 12 are designed so that the associated feedback amplifiers A1 and A2 have low DC gains, in the order of ten. This makes it possible to employ amplifiers in this network which have lower gain bandwidth products, e.g., in the order of ten, then might be thought possible. This network 55 employs only two capacitors 15 and 16, which is the theoretical minimum number of capacitors for a network having a quadratic transfer function. The capacitors 15 and 16 are part of the feedback impedances connected across associated amplifiers A1 and A2 to provide integrator-type configurations there which are desirable for stability at high frequencies. The capacitances of elements 15 and 16 are preferably the same values for simplicity of construction, although this is not essential. The design of the network is also simplified if the feedback resistors 11 and 12 have the same values of resistance, although they may be different.

The third amplifier A3 is an inverting amplifier having the feedback resistor 13 connected across it. The resistances of the pairs of elements 3 and 13 are also preferably the same values for simplifying the design of the inverting amplifier A3, although this is not essential. Feed-forward resistors 19 and 20 are also connected between input line 5 and the amplifier-input sides of resistors 2 and 3, respectively. Finally, a feedback resistor 21 is connected between the output line 6 from A3 and the input line 24 to A1.

The transfer function of a general biquadratic equation is representable as $$\frac{E_{out}(s)}{E_{in}(s)} = -\frac{n2 s^2 + n1 s + n0}{d2 s^2 + d1 s + d0} \quad (1)$$

where $s$ is the complex frequency variable, and $n2$, $n1$, $n0$, $d2$, $d1$, and $d0$ are positive real coefficients.

Assume, for the sake of simplicity of illustration, that the two elements of each pair of resistors 2 and 21, 3 and 13, and 11 and 12, and of capacitors 15 and 16 have the same values; that the values of network elements are at least initially normalized with respect to the capacitance of the capacitors 15 and 16; and that the values of resistors 3 and 13 are selected to make the normalized values thereof also be unity. Elementary network analysis for this circuit configuration, with ideal amplifiers and the above assumptions, then gives a network transfer function of $$\frac{E_{out}(s)}{E_{in}(s)} = - \frac{g5 s^2 + (2 g2\, g5 - g4)s + (g1\, g3 - g2\, g4 + g2^2\, g5)}{s^2 + 2 g2 s + (g2^2 + g3^2)} \quad (2)$$

where the $g$'s represent the normalized conductances of associated resistors as indicated in the figure. Equation (2) is the general biquadratic transfer function in equation (1), expressed in terms of values of elements in network 55. By specifying only the normalized conductances g1 to g5 of associated resistors, this network can be tailored to have different prescribed second-order transfer functions. This reduces the requirements on values of the capacitors 15 and 16.

Requiring that values of elements satisfy the relationships $$g2 = d\frac{1}{2}; \quad g3 = \sqrt{d0 - g2^2}; \quad g4 = d1 n2; \quad (3)$$

$$g5 = n2; \quad g1 = \frac{n0 + g2^2 n2}{g3},$$

then equation (2) reduces to $$\frac{E_{out}(s)}{E_{in}(s)} = - \frac{n2 s^2 + n0}{s^2 + d1 s + d0} \quad (4)$$

where $n0$, $n2$, $d0$, and $d1$ are the general coefficients specified in equation (3), $d2 = 1$ and $n1 = 0$ here. The transfer function in equation (4) is a biquadratic equation, of course. More specifically, equation (4) is the transfer function for either a lowpass or a highpass notch filter. By selecting a particular transfer function to be satisfied by the network, the frequency response of the network is specified and particular values of the biquadratic coefficients are obtained. These coefficient values are employed in the relationships in equation (3) to provide specific values of the normalized conductances there. The circuit is then denormalized by setting the capacitances equal to a particular desired capacitance $C_o$ and the resistances equal to $1/(gi\ 2\pi\ f_o\ C_o)$, where $i = 1, 2, \ldots 5$, and $f_o$ is the frequency at which the filter is desired to operate. In this instance, both of the resistors 2 and 21 have the same values as do the elements of the pairs of resistors 3 and 13, of resistors 11 and 12, and of capacitors 15 and 16. Alternatively, the circuit may be denormalized by denormalizing each amplifier section by itself to provide a network in which the elements of an element pair have different values. In this latter case, the representation of the transfer function of network 55 is then more complex than that shown in equation (4), although the network 55 in both cases has the same frequency response.

The same network 55 is made to simulate an all-pass filter structure having a transfer function $$\frac{E_{out}(s)}{E_{in}(s)} = -A\left(\frac{s^2 - n1s + n0}{s^2 + n1s + n0}\right) \quad (5)$$

by requiring that element values satisfy the relationships $$g2 = n\frac{1}{2}; \quad g3 = \sqrt{n0 - g2^2}; \quad g4 = 2A\ n1 \quad (6)$$

$$g5 = A; \quad g1 = \frac{g2\ g4}{g3} + g3\ g5$$

where $n1$ and $n0$ here are quadratic coefficients which have positive values, A is the gain of the circuit 55, $d2 = n2 = 1$, $d1 = n1$, and $d0 = n0$. Such a network has a constant loss and a variable phase delay. The particular frequency characteristics of this structure defined by equation (5) are set by selecting specific values of the remaining coefficients $n1$ and $n0$ and the gain A, and then denormalizing element values as was generally outlined above. The same network is caused to simulate an attenuation equalizer by changing the values of only $g2$ and $g4$ such that they satisfy the relationships $$g2 = d1/2 \text{ and } g4 = g5(d1 - n1). \quad (7)$$

The transfer function for this attenuation equalizer is representable as $$\frac{E_{out}(s)}{E_{in}(s)} = -A\left(\frac{s^2 + n1s + n0}{s^2 + d1s + n0}\right) \quad (8)$$

where $d1$, $n1$, and $n0$ here are quadratic coefficients, $d2 = n2 = 1$, $d0 = n0$, and $d1$ is greater than $n1$. In summary, the values of network elements for this attenuation equalizer satisfy the relationship $$g1 = \frac{g2\ g4}{g3} + g3\ g5; \quad g2 = d\frac{1}{2}; \quad g3 = \sqrt{n0 - g2^2}; \quad (9)$$

$$g4 = g5(d1 - n1); \quad g5 = A.$$

Further, the aforementioned network defined by equation (8) simulates an attenuation and phase equalizer satisfying the generalized transfer function $$\frac{E_{out}(s)}{E_{in}(s)} = -A\left(\frac{s^2 - n1s + n0}{s^2 + d1s + n0}\right) \quad (10)$$

by merely requiring that the coefficient $n1$ be negative. As stated previously, particular values of the quadratic coefficients, and finally element values, are obtained afer first selecting a particular transfer function to be satisfied by the network.

In an alternate embodiment of the invention, the network 55 simulates a highpass, all-pole filter by requiring that the normalized element values satisfy the relationship $$g1 = \frac{n2\ d1^2}{4g3} = \frac{n2\ g2^2}{g3}; \quad g2 = d\frac{1}{2}; \quad (11)$$

$$g3 = \sqrt{d0 - g2^2}; \quad g4 = d1\ n2; \quad g5 = n2.$$

This highpass circuit has the generalized transfer function $$\frac{E_{out}(s)}{E_{in}(s)} = -\frac{n2\ s^2}{s^2 + d1s + d0} \quad (12)$$

where $d2 = 1$ and $n1 = n0 = 0$.

This same network 55 is modified to operate as a bandpass filter defined by the generalized transfer function $$\frac{E_{out}(s)}{E_{in}(s)} = -\frac{n1\ s}{s^2 + d1s + d0} \quad (13)$$

where $d2 = 1$ and $n2 = n0 = 0$, by requiring that the element values satisfy the relationships $$g1 = g2\ g4/g3; g2 = d1/2; g3 = \sqrt{d0 - g2^2}; g4 = n1;$$
$$g5 = 0. \quad (14)$$

In this bandpass circuit, the resistor 20 has an infinite impedance such that it is replaced by an open circuit. The same network 55 is modified to operate as a lowpass, all-pole filter having a general transfer function $$\frac{E_{out}(s)}{E_{in}(s)} = -\frac{n0}{s^2 + d1s + d0} \quad (15)$$

where $d2 = 1$ and $n2 = n1 = 0$, by requiring that the element values satisfy the relationships $$g1 = n0/g3; g2 = d1/2; g3 = \sqrt{d0 - g2^2}; g4 = g5 = 0. \quad (16)$$

In this lowpass circuit, the resistances of both of the feedforward resistors 19 and 20 are infinite such that they are replaced by open circuits.

The network 55 may also be made to simulate a circuit having the transfer function $$\frac{E_{out}(s)}{E_{in}(s)} = -A\left(\frac{s^2 + n0}{s^2 + d0}\right) \quad (17)$$

where $d2 = n2 = 1$ and $d1 = n1 = 0$, by requiring that the element values satisfy the relationships $$g1 = \frac{n0 \, A}{g3}; \quad g2 = 0; \quad g3 = \sqrt{d0}; \quad (18)$$

$$g4 = 0; \quad g5 = A.$$

In this circuit, the resistors 11, 12, and 19 are replaced by open circuits. Such a filter circuit has particular application in networks having multiple feedback paths.

By way of example, a typical highpass notch filter has a transfer function of the form in equation (4) where $d0 = 1$, $d1 = 0.1$, $n0 = 0.25$, and $n2 = 1$. This is a highpass filter with a normalized loss pole at $\omega = 0.5$. Values of normalized conductances computed from equation (3) are $g1 = 0.2528$, $g2 = 0.05$, $g3 = 0.9987$, $g4 = 0.1$, and $g5 = 1$. If the filter is to operate at 1 kHz, the capacitances of capacitors 15 and 16 may be 10 nanofarads. Denormalized resistances of associated resistors are therefore $R1 = 62.96 \, k\Omega$; $R2 = R21 = 15.92 \, k\Omega$; $R3 = R13 = 15.92 \, k\Omega$; $R11 = R12 = 318.3 \, k\Omega$; $R19 = 159.2 \, k\Omega$; and $R20 = 15.92 \, k\Omega$.

Although this invention is described in relation to preferred embodiments thereof, variations and modifications will be apparent to those skilled in the art. By way of example, the output of the network may be coupled from either of the low-impedance output lines 25 and 26 at the amplifiers, as well as from the low-impedance output line 6, although the transfer function of the resulting network will then be different from those specified above.

What is claimed is:

1. A frequency-selective network satisfying a prescribed transfer function, the network including input and output ports with only one terminals thereof being grounded and having a transfer function which is generally representable as $$\frac{E_{out}(s)}{E_{in}(s)} = -\frac{(n2s^2 + n1s + n0)}{(d2s^2 + d1s + d0)},$$

where $n2$, $n1$, $n0$, $d2$, $d1$, and $d0$ are constant coefficients which may be zero and $s$ is the complex frequency variable, the network comprising: first, second, and third operational amplifiers each having at least one input line and having at least one output line; first, second, and third input resistors in the one input lines of associated amplifiers; said first, second, and third resistors and first, second, and third amplifiers being electrically connected in series, the one input line of said first amplifier being electrically connected through said first resistor to the other — ungrounded input terminal; the parallel combination of a fourth resistor and a first capacitor electrically connected between the one output line and the one input line of said first amplifier; the parallel combination of a fifth resistor and a second capacitor electrically connected between the one output line and the one input line of said second amplifier; a sixth resistor electrically connected between the one output line and the one input line of said third amplifier; a seventh resistor electrically connected between the third amplifier one output line and the first amplifier one input line; an eighth resistor electrically connected between the second amplifier one input line and the other — ungrounded input terminal; a ninth resistor electrically connected between the third amplifier one input line and the other — ungrounded input terminal; and means for coupling the other — ungrounded output terminal to one output line of one of said amplifiers; the network transfer function being a function of the normalized conductances $g1$, $g2$, $g3$, $g4$, and $g5$ of said first, fourth, second, eighth, and ninth resistors, respectively, being prescribed by selected values of these conductances which are at least initially normalized with respect to the capacitances of said first and second capacitors with the normalized conductances of said third and sixth resistors being at least initially set to unity, and being representable as $$\frac{E_{out}(s)}{E_{in}(s)} =$$

$$-\frac{(g5s^2 + (2g2\,g5 - g4)s + (g1\,g3 - g2\,g4 + g2^2\,g5))}{(s^2 + 2g2s + (g2^2 + g3^2))};$$

normalized capacitances of said first and second capacitors both being unity; normalized conductances of said fourth and fifth resistors being the same values; normalized conductances of said second and seventh resistors being the same values; and normalized conductances of said third and sixth resistors being the same values.

2. A frequency-selective network satisfying a prescribed transfer function for operating as a notch filter, the network including input and output ports with only one terminals thereof being grounded and having a transfer function which is generally representable as $$\frac{E_{out}(s)}{E_{in}(s)} = -\frac{(n2s^2 + n1s + n0)}{(d2s^2 + d1s + d0)},$$

where $n2$, $n1$, $n0$, $d2$, $d1$, and $d0$ are constant coefficients which may be zero and $s$ is the complex frequency variable, the network comprising: first, second, and third operational amplifiers each having at least one input line and having at least one output line; first, second, and third input resistors in the one input lines of associated amplifiers; said first, second, and third resistors and first, second, and third amplifiers being electrically connected in series, the one input line of said first amplifier being electrically connected through said first resistor to the other - ungrounded input terminal; the parallel combination of a fourth resistor and a first capacitor electrically connected between the one output line and the one input line of said first amplifier; the parallel combination of a fifth resistor and a second capacitor electrically connected between the one output line and the one input line of said second amplifier; a sixth resistor electrically connected between the one output line and the one input line of said third amplifier; a seventh resistor electrically connected between the third amplifier one output line and the first amplifier one input line; an eighth resistor electrically connected between the second amplifier one input line and the other — ungrounded input terminal; a ninth resistor electrically connected between the third amplifier one input line and the other — ungrounded input terminal; and means for coupling the other — ungrounded output terminal to one output line of one of said amplifiers; the network transfer function being a function of the normalized conductances $g1, g2, g3, g4$, and $g5$ of said first, fourth, second, eighth, and ninth resistors, respectively, being prescribed by selected values of these conductances which are at least initially normalized with respect to the capacitances of said first and second capacitors with the normalized conductances of said third and sixth resistors being at least initially set to unity, and being representable as $$\frac{E_{out}(s)}{E_{in}(s)} = -\frac{(g5s^2 + (2g2\,g5 - g4)s + (g1\,g3 - g2\,g4 + g2^2 g5))}{(s^2 + 2g2s + (g2^2 + g3^2))};$$

the coefficients and normalized conductances of said resistors satisfying the requirements that $$g1 = \frac{(n0 + g2^2\,n2)}{g3} ; g2 = \frac{d1}{2} ; g3 = \sqrt{d0 - g2^2} ; g4 = d1\,n2; g5 = n2,$$

the prescribed transfer function being representable as $$\frac{E_{out}(s)}{E_{in}(s)} = -\frac{(n2s^2 + n0)}{(s^2 + d1s + d0)},$$

where $n1 = 0$ and $d2 = 1$.

3. A frequency-selective network satisfying a prescribed transfer function for operating as an all-pass filter, the network including input and output ports with only one terminals thereof being grounded and having a transfer function which is generally representable as $$\frac{E_{out}(s)}{E_{in}(s)} = -\frac{(n2s^2 + n1s + n0)}{(d2s^2 + d1s + d0)},$$

where $n2, n1, n0, d2, d1$, and $d0$ are constant coefficients which may be zero and s is the complex frequency variable, the network comprising: first, second, and third operational amplifiers each having at least one input line and having at least one output line; first, second, and third input resistors in the one input lines of associated amplifiers; said first, second, and third resistors and first, second, and third amplifiers being electrically connected in series, the one input line of said first amplifier being electrically connected through said first resistor to the other — ungrounded input terminal; the parallel combination of a fourth resistor and a first capacitor electrically connected between the one output line and the one input line of said first amplifier; the parallel combination of a fifth resistor and a second capacitor electrically connected between the one output line and the one input line of said second amplifier; a sixth resistor electrically connected between the one output line and the one input line of said third amplifier; a seventh resistor electrically connected between the third amplifier one output line and the first amplifier one input line; an eighth resistor electrically connected between the second amplifier one input line and the other — ungrounded input terminal; a ninth resistor electrically connected between the third amplifier one input line and the other — ungrounded input terminal; and means for coupling the other — ungrounded output terminal to one output line of one of said amplifiers; the network transfer function being a function of the normalized conductances $g1, g2, g3, g4$, and $g5$ of said first, fourth, second, eighth, and ninth resistors, respectively, being prescribed by selected values of these conductances which are at least initially normalized with respect to the capacitances of said first and second capacitors with the normalized conductances of said third and sixth resistors being at least initally set to unity, and being representable as $$\frac{E_{out}(s)}{E_{in}(s)} = -\frac{(g5s^2 + (2g2\,g5 - g4)s + (g1\,g3 - g2\,g4 + g2^2 g5))}{(s^2 + 2g2s + (g2^2 + g3^2))};$$

the coefficients and normalized conductances of said resistors satisfying the requirements that $$g1 = \frac{(g2\,g4)}{(g3)} + g3\,g5; g2 = \frac{n1}{2} ; g3 = \sqrt{n0 - g2^2} ; g4 = 2An1;$$

where A is the gain of the network, the prescribed transfer function being presentable as $$\frac{E_{out}(s)}{E_{in}(s)} = -A\frac{(s^2 - n1s + n0)}{(s^2 + n1s + n0)},$$

where $d2 = n2 = 1, d1 = n1$, and $d0 = n0$.

4. A frequency-selective network satisfying a prescribed transfer function for operating as an attenuation equalizer, the network including input and output ports with only one terminals thereof being grounded and having a transfer function which is generally representable as $$\frac{E_{out}(s)}{E_{in}(s)} = -\frac{(n2s^2 + n1s + n0)}{(d2s^2 + d1s + d0)},$$

where $n2, n1, n0, d2, d1$, and $d0$ are constant coefficients which may be zero and s is the complex frequency variable, the network comprising: first, second, and third operational amplifiers each having at least one input line and having at least one output line; first, second, and third input resistors in the one input lines of associated amplifiers; said first, second, and third resistors and first, second, and third amplifiers being electrically connected in series, the one input line of said first amplifier being electrically connected through said first resistor to the other — ungrounded input terminal; the parallel combination of a fourth resistor and a first capacitor electrically connected between the one output line and the one input line of said first amplifier; the parallel combination of a fifth resistor and a second capacitor electrically connected between the one output line and the one input line of said second amplifier; a sixth resistor electrically connected between the one output line and the one input line of said third amplifier; a seventh resistor electrically connected between the third amplifier one output line and the first amplifier one input line; an eighth resistor electrically connected between the second amplifier one input line and the other — ungrounded input terminal; a ninth resistor electrically connected between the third amplifier one input line and the other — ungrounded input terminal; and means for coupling the other — ungrounded output terminal to one output line of one of said amplifiers; the network transfer function being a function of the normalized conductances $g1$, $g2$, $g3$, $g4$, and $g5$ of said first, fourth, second, eighth, and ninth resistors, respectively, being prescribed by selected values of these conductances which are at least initially normalized with respect to the capacitances of said first and second capacitors with the normalized conductances of said third and sixth resistors being at least initially set to unity, and being representable as $$\frac{E_{out}(s)}{E_{in}(s)} = -\frac{(g5s^2 + (2g2\,g5 - g4)s + (g1\,g3 - g2\,g4 + g2^2\,g5))}{(s^2 + 2g2s + (g2^2 + g3^2))};$$

the coefficients and normalized conductances of said resistors satisfying the requirements that $$g1 = \frac{(g2\,g4)}{(g3)} + g3\,g5;\ g2 = \frac{d1}{2},\ g3 = \sqrt{n0 - g2^2}\ ;\ g4 = g5(d1 - n1),\ \text{and}\ g5 = A,$$

the prescribed transfer function being representable as $$\frac{E_{out}(s)}{E_{in}(s)} = -A\frac{(s^2 + n1s + n0)}{(s^2 + d1s + n0)},$$

where $d2 = n2 = 1$, $d1$ is greater than $n1$, and $d0 = n0$.

5. The network according to claim 4, wherein the value of $n1$ is negative, the network now operating as an attenuation and phase equalizer.

6. A frequency-selective network satisfying a prescribed transfer function for operating as a high-pass, all-pole filter structure, the network including input and output ports with only one terminals thereof being grounded and having a transfer function which is generally representable as $$\frac{E_{out}(s)}{E_{in}(s)} = -\frac{(n2s^2 + n1s + n0)}{(d2s^2 + d1s + d0)},$$

where $n2$, $n1$, $n0$, $d2$, $d1$, and $d0$ are constant coefficients which may be zero and s is the complex frequency variable, the network comprising: first, second, and third operational amplifiers each having at least one input line and having at least one output line; first, second, and third input resistors in the one input lines of associated amplifiers; said first, second, and third resistors and first, second, and third amplifiers being electrically connected in series, the one input line of said first amplifier being electrically connected through said first resistor to the other — ungrounded input terminal; the parallel combination of a fourth resistor and a first capacitor electrically connected between the one output line and the one input line of said first amplifier; the parallel combination of a fifth resistor and a second capacitor electrically connected between the one output line and the one input line of said second amplifier; a sixth resistor electrically connected between the one output line and the one input line of said third amplifier; a seventh resistor electrically connected between the third amplifier one output line and the first amplifier one input line; an eighth resistor electrically connected between the second amplifier one input line and the other — ungrounded input terminal; a ninth resistor electrically connected between the third amplifier one input line and the other — ungrounded input terminal; and means for coupling the other — ungrounded output terminal to one output line of one of said amplifiers; the prescribed transfer function being a function of the normalized conductances $g1$, $g2$, $g3$, $g4$, and $g5$ of said first, fourth, second, eighth, and ninth resistors, respectively, being prescribed by selected values of these conductances which are at least initially normalized with respect to the capacitances of said first and second capacitors with the normalized conductances of said third and sixth resistors being at least initially set to unity, and being representable as $$\frac{E_{out}(s)}{E_{in}(s)} = -\frac{(g5s^2 + (2g2\,g5 - g4)s + (g1\,g3 - g2\,g4 + g2^2\,g5))}{(s^2 + 2g2s + (g2^2 + g3^2))} = -\frac{(n2\,s^2)}{(s^2 + d1s + d0)},$$

where $n1 = n0 = 0$ and $d2 = 1$, values of other coefficients and normalized conductances of said resistors satisfying the relationships $$g1 = \frac{(n2\,d1^2)}{(4g3)} = \frac{(n2\,g2^2)}{(g3)};\ g2 = \frac{d1}{2};\ g3 = \sqrt{d0 - g2^2}\ ;\ g4 = d1\,n2;\ g5 = n2.$$

7. A frequency-selective network satisfying a prescribed transfer function for operating as a bandpass filter, the network including input and output ports with only one terminals thereof being grounded and having a transfer function which is generally representable as $$\frac{E_{out}(s)}{E_{in}(s)} = -\frac{(n2s^2 + n1s + n0)}{(d2s^2 + d1s + d0)},$$

where $n2$, $n1$, $n0$, $d2$, $d1$, and $d0$ are constant coefficients which may be zero and s is the complex frequency variable, the network comprising: first, second, and third operational amplifiers each having at least one input line and having at least one output line; first, second, and third input resistors in the one input lines of associated amplifiers; said first, second, and third resistors and first, second, and third amplifiers being electrically connected in series, the one input line of said first amplifier being electrically connected through said first resistor to the other — ungrounded input terminal; the parallel combination of a fourth resistor and a first capacitor electrically connected between the one output line and the one input line of said first amplifier; the parallel combination of a fifth resistor and a second capacitor electrically connected between the one output line and the one input line of said second amplifier; a sixth resistor electrically connected between the one output line and the one input line of said third amplifier; a seventh resistor electrically connected between the third amplifier one output line and the first amplifier one input line; an eighth resistor electrically connected between the second amplifier one input line and the other — ungrounded input terminal; and means for coupling the other — ungrounded output terminal to one output line of one of said amplifiers; the prescribed transfer function being a function of the normalized conductances $g1$, $g2$, $g3$ and $g4$ of said first, fourth, second, and eighth resistors, respectively, being prescribed by selected values of these conductances which are at least initially normalized with respect to the capacitances of said first and second capacitors with the normalized conductances of said third and sixth resistors being at least initially set to unity, and being representable as $$\frac{E_{out}(s)}{E_{in}(s)} = -\frac{(-g4s + (g1\,g3 - g2\,g4))}{(s^2 + 2g2s + (g2^2 + g3^2))} =$$

$$-\frac{(n1\,s)}{(s^2 + d1s + d0)},$$

where $n2 = n0 = 0$ and $d2 = 1$, values of other coefficients and normalized conductances of said resistors satisfying the relationships $g1 = g2g4/g3$; $g2 = d1/2$; $g3 = \sqrt{d0 - g2^2}$; $g4 = n1$.

8. A frequency-selective network satisfying a prescribed transfer function for operating as a low-pass, all-pole filter, the network including input and output ports with only one terminals thereof being grounded and having a transfer function which is generally representable as $$\frac{E_{out}(s)}{E_{in}(s)} = -\frac{(n2s^2 + n1s + n0)}{(d2s^2 + d1s + d0)},$$

where $n2, n1, n0, d2, d1,$ and $d0$ are constant coefficients which may be zero and s is the complex frequency variable, the network comprising: first, second, and third operational amplifiers each having at least one input line and having a least one output line; first, second, and third input resistors in the one input lines of associated amplifiers; said first, second, and third resistors and first, second, and third amplifiers being electrically connected in series, the one input line of said first amplifier being electrically connected through said first resistor to the other — ungrounded input terminal; the parallel combination of a fourth resistor and a first capacitor electrically connected between the one output line and the one input line of said first amplifier; the parallel combination of a fifth resistor and a second capacitor electrically connected between the one output line and the one input line of said second amplifier; a sixth resistor electrically connected between the one output line and the one input line of said third amplifier; a seventh resistor electrically connected between the third amplifier one output line and the first amplifier one input line; and means for coupling the other — ungrounded output terminal to one output line of one of said amplifiers; the prescribed transfer function being a function of the normalized conductances $g1$, $g2$, and $g3$ of said first, fourth, and second resistors, repectively, being prescribed by selected values of these conductances which are at least initially normalized with respect to the capacitances of said first and second capacitors with the normalized conductances of said third and sixth resistors being at least initially set to unity, and being representable as $$\frac{E_{out}(s)}{E_{in}(s)} = \frac{-(g1\,g3)}{(s^2 + 2g2s + (g2^2 + g3^2))} = \frac{-(n0)}{(s^2 + d1s + d0)},$$

where $n2 = n1 = 0$ and $d2 = 1$, values of the other coefficients and the normalized conductances of said resistors satisfying the relationships $$g1 = n0/g3;\ g2 = d1/2;\ g3 = \sqrt{d0 - g2^2}.$$

9. A frequency-selective network satisfying a prescribed transfer function, the network including input and output ports with only one terminals thereof being grounded and having a transfer function which is generally representable as $$\frac{E_{out}(s)}{E_{in}(s)} = -\frac{(n2s^2 + n1s + n0)}{(d2s^2 + d1s + d0)},$$

where $n2, n1, n0, d2, d1,$ and $d0$ are constant coefficients which may be zero and s is the complex frequency variable, the network comprising: first, second, and third operational amplifiers each having at least one input line and having at least one output line; first, second, and third input resistors in the one input lines of associated amplifiers; said first, second, and third resistors and first, second, and third amplifiers being electrically connected in series, the one input line of said first amplifier being electrically connected through said first resistor to the other — ungrounded input terminal; a first capacitor electrically connected between the one output line and the one input line of said first amplifier; a second capacitor electrically connected between the one output line and the one input line of said second amplifier; a fourth resistor electrically connected between the one output line and the one input line of said third amplifier; a fifth resistor electrically connected between the third amplifier one output line and the first amplifier one input line; a sixth resistor electrically connected between the third amplifier one input line and the other — ungrounded input terminal; and means for coupling the other — ungrounded output terminal to one output line of one of said amplifiers; the particular transfer function being a function of the normalized conductances $g1$, $g2$, and $g3$ of said first, second and sixth resistors, respectively, being prescribed by selected values of these conductances which are at least initially normalized with respect to the capacitances of said first and second capacitors with the normalized conductances of said third and fourth resistors being at least initially set to unity, and being representable as $$\frac{E_{out}(s)}{E_{in}(s)} = -\frac{(g3s^2 + g1\,g2)}{(s^2 + g2^2)} = -A\frac{(s^2 + n0)}{(s^2 + d0)},$$

where A is the gain of network, $n2 = d2 = 1$, and $n1 = d1 = 0$, values of other coefficients and the normalized conductances of said resistors satisfying the relationships $$g1 = \frac{n0\,A}{g2};\ g2 = \sqrt{d0}\ ;\ g3 = A.$$

10. A frequency-selective network satisfying a prescribed transfer function for operating as an attenuation and phase equalizer, the network including input and output ports with only one terminals thereof being grounded and having a transfer function which is generally representable as $$\frac{E_{out}(s)}{E_{in}(s)} = - \frac{(n2 s^2 + n1 s + n0)}{(d2 s^2 + d1 s + d0)} ,$$

where $n2$, $n1$, $n0$, $d2$, $d1$, and $d0$ are constant coefficients which may be zero and $s$ is the complex frequency variable, the network comprising: first, second, and third operational amplifiers each having at least one input line and having at least one output line; first, second, and third input resistors in the one input lines of associated amplifiers; said first, second, and third resistors and first, second, and third amplifiers being electrically connected in series, the one input line of said first amplifier being electrically connected through said first resistor to the other — ungrounded input terminal; the parallel combination of a fourth resistor and a first capacitor electrically connected between the one output line and the one input line of said first amplifier; the parallel combination of a fifth resistor and a second capacitor electrically connected between the one output line and the one input line of said second amplifier; a sixth resistor electrically connected between the one output line and the one input line of said third amplifier; a seventh resistor electrically connected between the third amplifier one output line and the first amplifier one input line; an eighth resistor electrically connected between the second amplifier one input line and the other — ungrounded input terminal; a ninth resistor electrically connected between the third amplifier one input line and the other — ungrounded input terminal; and means for coupling the other — ungrounded output terminal to one output line of one of said amplifiers; the network transfer function being a function of the normalized conductances $g1$, $g2$, $g3$, $g4$ and $g5$ of said first, fourth, second, eighth, and ninth resistors, respectively, being prescribed by selected values of these conductances which are at least initially normalized with respect to the capacitances of said first and second capacitors with the normalized conductances of said third and sixth resistors being at least initially set to unity, and being representable as $$\frac{E_{out}(s)}{E_{in}(s)} = - \frac{(g5 s^2 + (2 g2\, g5 - g4)s + (g1\, g3 - g2\, g4 + g2^2\, g5))}{(s^2 + 2 g2 s + (g2^2 + g3^2))} ;$$

the coefficients and normalized conductances of said resistors satisfying the requirements that $$g1 = \frac{(g2\, g4)}{(g3)} + g3\, g5; \quad g2 = \frac{d1}{2} ; \quad g3 = \sqrt{n0 - g2^2} ; \quad g4 = g5(d1 - n1); \quad g5 = A,$$

the transfer function of the network being representable as $$\frac{E_{out}(s)}{E_{in}(s)} = - A \frac{(s^2 - n1 s + n0)}{(s^2 + d1 s + n0)} ,$$

where A is the gain of the network, $d2 = n2 = 1$ and $d0 = n0$.

* * * * *